(12) United States Patent
Huang et al.

(10) Patent No.: US 8,903,532 B2
(45) Date of Patent: Dec. 2, 2014

(54) LITHO CLUSTER AND MODULIZATION TO ENHANCE PRODUCTIVITY

(75) Inventors: I-Hsiung Huang, Hsinchu County (TW); Heng-Hsin Liu, New Taipei (TW); Heng-Jen Lee, Hsinchu County (TW); Chin-Hsiang Lin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 20 days.

(21) Appl. No.: 13/429,921

(22) Filed: Mar. 26, 2012

(65) Prior Publication Data

US 2013/0252175 A1 Sep. 26, 2013

(51) Int. Cl.
*H01L 31/18* (2006.01)

(52) U.S. Cl.
USPC .......................................................... 700/112

(58) Field of Classification Search
USPC ....................... 430/311; 700/112; 414/222.01
See application file for complete search history.

(56) References Cited

U.S. PATENT DOCUMENTS

| 2002/0132052 A1* | 9/2002 | Kumar et al. .................. 427/350 |
| 2004/0123182 A1 | 6/2004 | Cross, Jr. et al. |
| 2004/0217302 A1 | 11/2004 | Shin et al. |
| 2011/0162706 A1* | 7/2011 | Borden et al. ................. 136/256 |
| 2012/0238074 A1* | 9/2012 | Santhanam et al. .......... 438/468 |

FOREIGN PATENT DOCUMENTS

| EP | 1722402 B1 | 6/2010 |
| KR | 20110016644 A | 2/2011 |
| WO | 0002239 A1 | 1/2000 |
| WO | 0067302 A1 | 11/2000 |
| WO | 2007077901 A1 | 7/2007 |
| WO | 2007145315 A1 | 12/2007 |

* cited by examiner

*Primary Examiner* — Brittany Raymond
(74) *Attorney, Agent, or Firm* — Eschweiler & Associates, LLC (57) ABSTRACT

The present disclosure relates to a lithographic tool arrangement for semiconductor workpiece processing. The lithographic tool arrangement groups lithographic tools into clusters, and selectively transfers a semiconductor workpiece between a plurality of lithographic tools of a first type in a first cluster to a plurality of lithographic tools of a second type in a second cluster. The selective transfer is achieved though a transfer assembly, which is coupled to a defect scan tool that identifies defects generated in the lithographic tool of the first type. The disclosed lithographic tool arrangement also utilizes shared structural elements such as a housing assembly, and shared functional elements such as gases and chemicals. The lithographic tool arrangement may consist of baking, coating, exposure, and development units configured to provide a modularization of these various components in order to optimize throughput and efficiency for a given lithographic fabrication process.

20 Claims, 7 Drawing Sheets

LITHO CLUSTER AND MODULIZATION TO ENHANCE PRODUCTIVITY

BACKGROUND

Integrated chips are formed by complex fabrication processes such as lithography. During lithography a semiconductor workpiece is subjected to different processing steps. Some of the processing steps may comprise coating of the semiconductor workpiece with photoresist chemicals, alignment of the semiconductor workpiece with a photomask to generate a pattern, exposure of the semiconductor workpiece to electromagnetic radiation or an electron beam, and developing the exposed semiconductor workpiece using a chemical solvent.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

Figure 1:
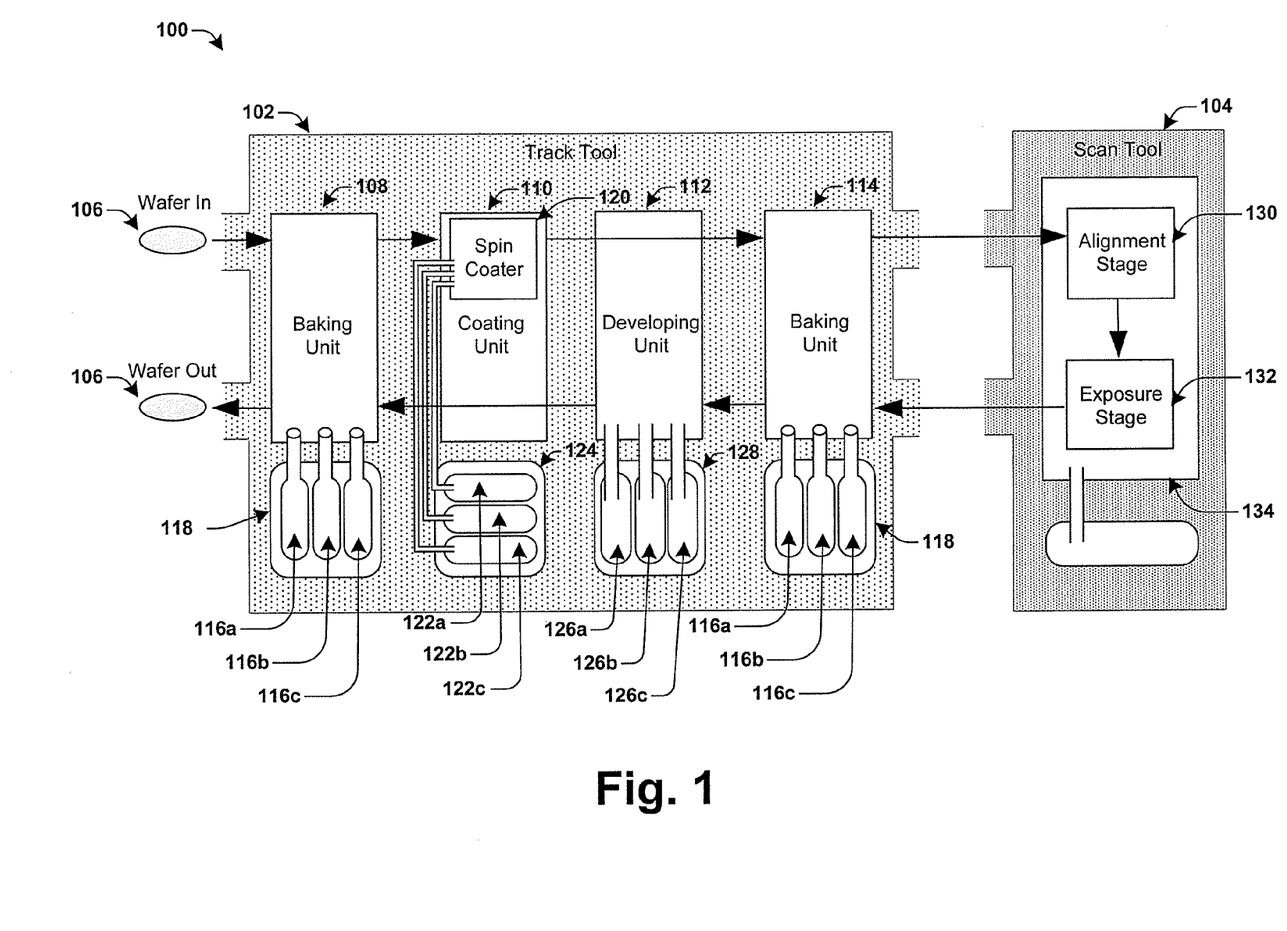
FIG. 1 illustrates a cross-sectional view of some embodiments of a lithographic tool cluster comprising a track tool and a scan tool.

FIG. 1 illustrates a cross-sectional view of a lithographic tool cluster 100, comprising a track tool 102 and a scan tool 104 for processing of a semiconductor workpiece 106. The track tool comprises a first baking unit 108, a coating unit 110, a developing unit 112, and a second baking unit 114. Each baking unit is coupled to multiple chemical sources 116a-116c contained within a chemical chamber 118. The coating unit 110 contains a spin coater 120, which is supplied with various photoresist chemicals 122a-122c contained within a resist chamber 124. The developer is coupled to chemical solvents 126a-126c contained within a developer chamber 128. The scan tool 104 comprises an alignment stage 130 and an exposure stage 132, as well as common facilities 134 (e.g., vacuum).

A semiconductor workpiece 106 undergoes processing steps by passing though the various units of the track tool 102 and scan tool 104 as illustrated in FIG. 1. The semiconductor workpiece is first placed within the track tool 102, then baked in the first baking unit 108, coated with a photoresist chemical 122a, 122b, or 122c in the spin coater 120, and baked again in the second baking unit 114. The semiconductor workpiece is then transferred into the scan tool 104, aligned with a photomask in the alignment stage 130, and exposed to electromagnetic radiation or an electron beam in the exposure stage 132. The semiconductor workpiece is then transferred back to the track tool 102. A third baking step is performed in the second baking unit 114. The exposed photoresist of the semiconductor workpiece is then developed in the developing unit 112 using one of the chemical solvents 126a, 126b, or 126c. Finally, a fourth baking step is performed in the first baking unit 108.

A key drawback of this arrangement occurs when multiple semiconductor workpieces require different processing in the same lithographic tool cluster 100. For instance, consider a semiconductor workpiece 106, which is coated with photoresist chemical 122a of a first type, followed by a second semiconductor workpiece (not shown) to be coated with photoresist chemical 122b of a second type. The spin coater 120 of this arrangement will require a time delay between these two coating steps during which it can be cleaned of the photoresist chemical 122a to prevent contamination during the processing with photoresist chemical 122b. Moreover, it will be appreciated by one of ordinary skill in the art that each of the various units of the track tool 102 and scan tool 104 will experience a similar time delay when a given processing step is altered for processing two semiconductor workpieces differently. Each time delay results in a subsequent throughput loss of the lithographic tool cluster 100.

Accordingly, the present disclosure relates to a lithographic tool arrangement for semiconductor workpiece processing to improve efficiency and throughput. The lithographic tool arrangement is configured to group a plurality of lithographic tools of a given type into clusters. The lithographic tool arrangement contains a transfer assembly that selectively transfers a semiconductor workpiece between any one of a plurality of lithographic tools in a first cluster to any one of a plurality of lithographic tools in a second cluster. In various embodiments the lithographic tools comprise baking, coating, exposure, and development units configured to provide a modularization of these various components to optimize throughput and efficiency for a given process.

Figure 2:
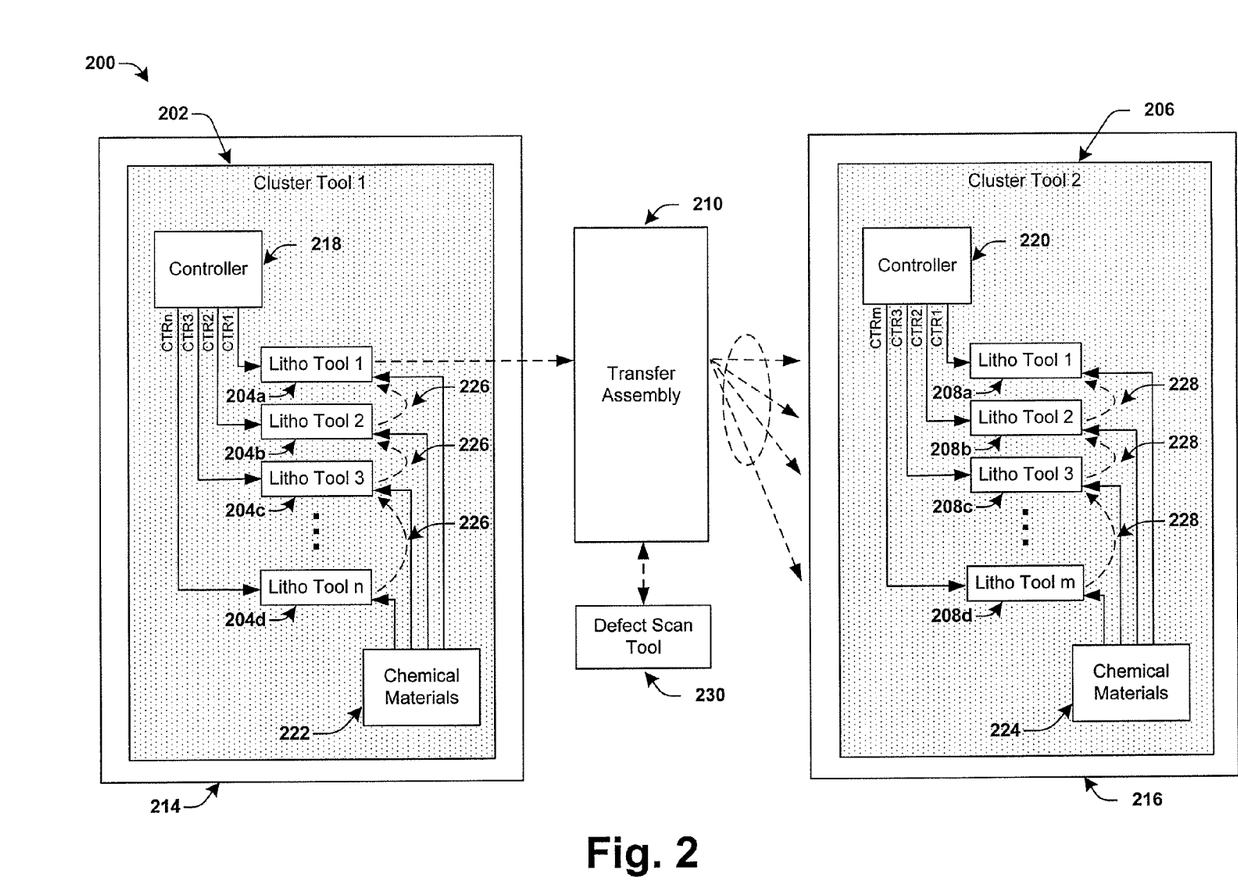
FIG. 2 illustrates some generic embodiments of a lithographic tool arrangement for semiconductor workpiece processing.

FIG. 2 illustrates some generic embodiments of a lithographic tool arrangement 200 for semiconductor workpiece processing which comprises a first cluster tool 202 comprising a plurality of lithographic tools 204a-204d of a first type, a second cluster tool 206 comprising a plurality of lithographic tools 208a-204d of a second type, and a transfer assembly 210 to move a semiconductor workpiece from any one of the plurality of lithographic tools 204a-204d of to any one of the plurality of lithographic tools 208a-208d. In this embodiment it is shown that a semiconductor workpiece selected from lithographic tool 204a in the first cluster tool 202 could be selectively transferred to any of the lithographic tools 208a-208d in the second cluster tool 204.

The lithographic tool arrangement 200 also comprises a shared housing assembly for the first cluster tool 214, and a shared housing assembly for the second cluster tool 216, which serve to isolate their respective lithographic tools from the ambient environment surrounding each cluster tool. Each cluster tool further comprises a controller, 218 and 220 for the first and second cluster tools respectively, which allow for independent control of their respective lithographic tools. For example, controller 218 allows for each of the lithographic tools 204a-204d of the first type to be operated independently.

Common delivery apparatuses, 222 and 224 for the first and second cluster tools 226 and 228, respectively, allow for delivery of chemical materials within each tool. The common delivery apparatuses 222 and 224 also enable sharing and recycling of the chemical materials between the lithographic tools within each respective cluster, 226 and 228.

The transfer assembly 210 is coupled to a defect scan tool 230 located between the first and second cluster tools. The defect scan tool 230 analyzes a semiconductor workpiece to identify defects generated upstream of the second cluster tool.

Note that while the lithographic tool arrangement 200 comprises two cluster tools, 214 and 216, that share a single transfer assembly 210, it will be appreciated to one of ordinary skill in the art that other embodiments may comprise three or more cluster tools with a plurality of transfer assemblies between each pair of cluster tools, or a single transfer assembly that operates between any combination of cluster tools.

Figure 3:
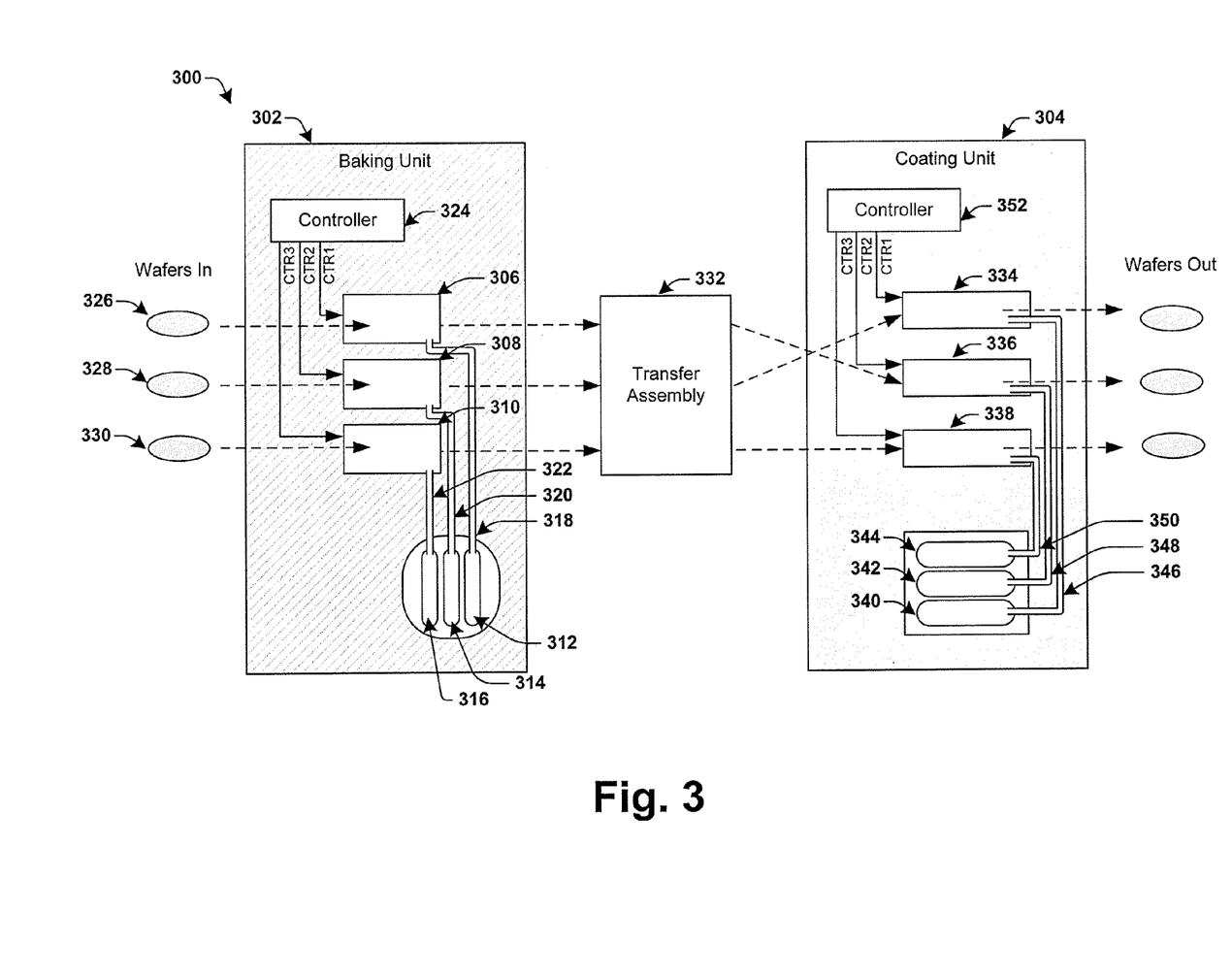
FIG. 3 illustrates some embodiments of a lithographic tool arrangement comprising a baking unit and a coating unit.

FIG. 3 illustrates some embodiments of a lithographic tool arrangement 300 comprising a baking unit 302 and a coating unit 304. The baking unit 302 comprises three baking chambers 306, 308, and 310, each coupled to a respective chemical source 312, 314, and 316 through respective piping 318, 320, and 322. Each of the three baking chambers 306, 308, and 310 can be independently controlled with a controller 324. The baking unit 302 shown in this embodiment can accommodate 3 separate semiconductor workpieces 326, 328, and 330, which are loaded into the baking unit 302. Each semiconductor workpiece 326, 328, and 330 is initially heated to a temperature sufficient to drive off any moisture that may be present on the front surface of the workpiece. In some embodiments, the semiconductor workpieces 326, 328, and 330 are then subjected to a Hexamethyldisilazane (HMDS) Prime Standard Operating Procedure to promote adhesion of photoresist in the subsequent coating step. This is typically achieved by applying HMDS from the gas phase to a heated semiconductor workpiece (e.g., 100° C.). However, the separate baking chambers 306, 308, and 310, respective chemical sources 312, 314, and 316, along with the controller 324 shown in this embodiment allow for independent control of each baking chamber 306, 308, and 310. As a result, different temperatures can be achieved within the baking chambers 306, 308, and 310 along with different concentrations of the HMDS gas from the respective chemical sources 312, 314, and 316.

After the HMDS prime is performed, each semiconductor workpiece 326, 328, and 330 is moved out of the baking unit 302 via a transfer assembly 332, and into one selected spin coater 334, 336, or 338 contained within the coating unit 304. The front surfaces of the semiconductor workpieces 326, 328, and 330 are supplied with a respective photoresist solution 340, 342, or 344 supplied to the respective spin coaters 334, 336, or 338. The semiconductor workpieces 326, 328, and 330 are then spun at a uniform rate for a predetermined time to produce a thin layer of photoresist of the desired thickness across their front surfaces. The spin rate and duration are a function of the evaporation rate of the photoresist solution used, and are typically on the order of 1200 to 4800 rpm for 30 to 60 seconds, and produces a layer of photoresist between approximately 0.5 and approximately 2.5 micrometers thick.

In this embodiment the transfer assembly 332 allows for selective transfer of a semiconductor workpiece 326, 328, or 330 to any of the selected spin coaters 334, 336, or 338 contained within the coating unit 304. This selected transfer of the transfer assembly 332, along with the independent control of the spin coaters 334, 336, and 338, allows for multiple baking and coating processes to occur in parallel. For example, consider semiconductor workpieces 326 and 328, both subjected to an HMDS prime step. Semiconductor workpiece 326 is primed at 90° C. for 30 seconds in baking chamber 306, while semiconductor workpiece 328 is primed at 150° C. for 120 seconds in baking chamber 308. The transfer assembly 332 removes semiconductor workpiece 326 from baking chamber 306 and selects spin coater 336 to coat semiconductor workpiece 326 with a 20% HMDS in propylene glycol methyl ether acetate (PGMEA) solvent and spin at 2,000 rpm for 30 seconds. Independently, the transfer assembly moves semiconductor workpiece 328 from baking chamber 308 to spin coater 334 to coat semiconductor workpiece 328 with a 10% HMDS in Propylene Glycol Monomethyl Ether (PGME) solvent and spin at 2,500 rpm for 60 seconds.

Figure 4:
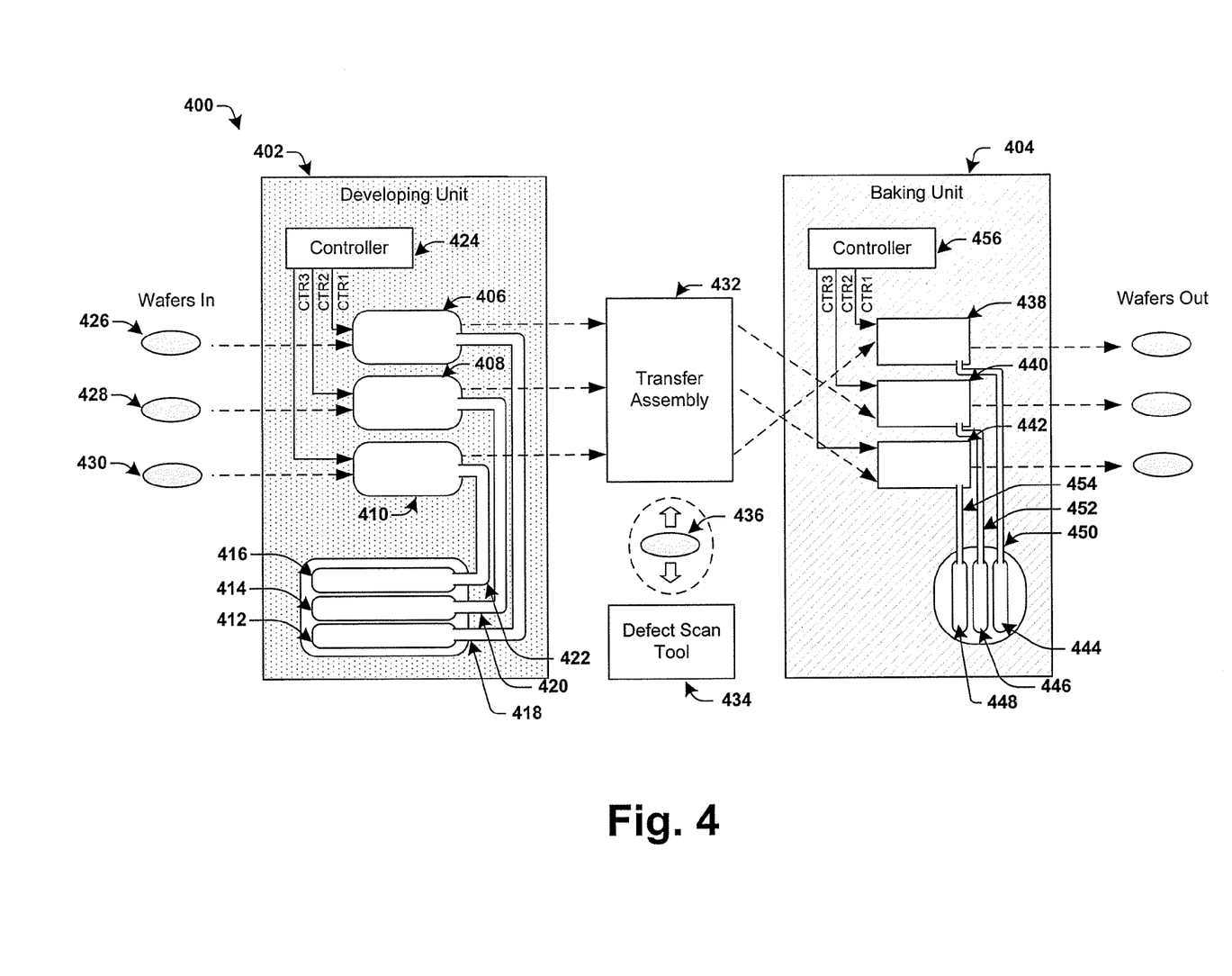
FIG. 4 illustrates some embodiments of a lithographic tool arrangement comprising a developing unit and a baking unit.

FIG. 4 illustrates one embodiment of a lithographic tool arrangement 400 comprising a developing unit 402 and a baking unit 404. The developing unit comprises three developers 406, 408, and 410 each coupled to a respective chemical source 412, 414, and 416 through respective piping 418, 420, and 422. Each of the three developers 406, 408, and 410 can be independently controlled with a controller 424. The developing unit 402 shown in this embodiment can accommodate 3 separate semiconductor workpieces 426, 428, and 430. Each semiconductor workpiece 426, 428, and 430 has undergone a previous exposure step which includes coating with photoresist, alignment with a photomask, and exposure to electromagnetic radiation or an electron beam as described above.

Each chemical source 412, 414, and 416 contains a chemical developer solution (e.g., alkaline solution) which is used to react with the photoresist film of the exposed semiconductor workpiece. The reaction depends on the type of photoresist solution used. The most common type of photoresist is positive photoresist, which becomes soluble when exposed and reacted with the developer solution. Unexposed positive photoresist becomes insoluble. The exposed positive photoresist is removed by the developer solution, thus creating a pattern of positive photoresist on the semiconductor workpieces 426, 428, and 430 that corresponding to the covered regions of the photomask. Negative resist has the opposite effect. The separate chemical sources 412, 414, and 416 containing different chemical developer solutions, along with the controller 424 shown in this embodiment allow for independent control of each developer 406, 408, and 410. Such independent control could allow for the use of different resist types for each developer 406, 408, and 410.

After the developing step, the semiconductor workpieces 426, 428, and 430 are moved out of the developing unit 402 via a transfer assembly 432, and into a selected baking chamber 438, 440, or 442 contained within the baking unit 404. Each of three baking chambers 438, 440, and 442 are coupled to respective chemical sources 444, 446, and 448 through respective piping 450, 452, and 454. Each of the three baking chambers can be independently controlled with a controller 456. The semiconductor workpieces 426, 428, and 430 are subjected to a post-develop bake, or post-bake, typically at 120° C. to 180° C. for approximately 20 to 30 minutes. This will harden the remaining photoresist so that it can be used as a protective layer for downstream fabrication steps such as ion implantation, wet chemical etching, or plasma etching.

In this embodiment the transfer assembly 432 allows for selective transfer of a given semiconductor workpiece 426, 428, or 430 to any of the baking chambers 438, 440, or 442 contained within the baking unit 404. This selected transfer of the transfer assembly 432, along with the independent control of the baking chambers 438, 440, and 442, allows for multiple developing and baking processes to occur in parallel. For example, semiconductor workpiece 426 could be coated with positive photoresist prior to exposure and reacted with a developer solution (e.g., 2.38% TMAH) in developer 406, while semiconductor workpiece 428 could be coated with negative photoresist prior to exposure and reacted with a negative developer solution (e.g., OSD-1000) in developer 408. The transfer assembly 432 removes semiconductor workpiece 426 from developer 406 and selects baking chamber 440 to give semiconductor workpiece 426 at post-bake at 120° C. for 20 minutes. Independently, the transfer assembly moves semiconductor workpiece 428 from developer 408 to baking chamber 442 to give semiconductor workpiece 428 a post-bake at 180° C. for 30 minutes.

In this embodiment the transfer assembly 432 is also coupled to a defect scan tool 434 which can transfer a semiconductor workpiece 436 to the defect scan tool to identify defects introduced upstream from the baking unit 404 (e.g., by the developer unit 402).

Figure 5:
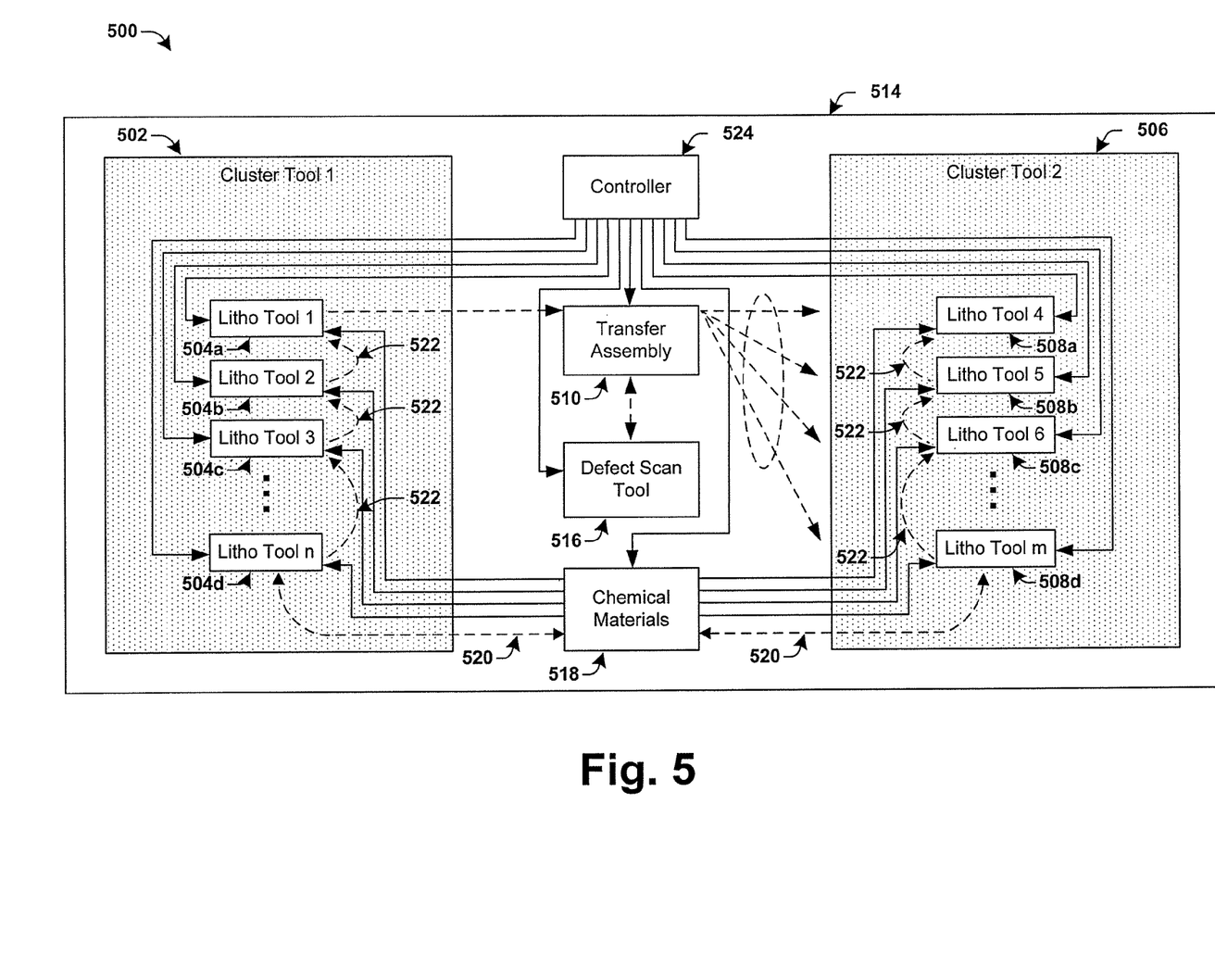
FIG. 5 illustrates some generic embodiments of a lithographic tool arrangement for semiconductor workpiece processing.

FIG. 5 illustrates some generic embodiments of a lithographic tool arrangement 500 for semiconductor workpiece processing comprising a first cluster tool 502 comprising a plurality of lithographic tools 504a-504d of a first type, a second cluster tool 506 comprising a plurality of lithographic tools 508a-508d of a second type, and a transfer assembly 510. The transfer assembly 510 moves a semiconductor workpiece from any one of the plurality of lithographic tools 504a-504d of to any one of the plurality of lithographic tools 508a-508d. In this embodiment it is shown that a semiconductor workpiece selected from lithographic tool could be selectively transferred to any of the lithographic tools 508a-508d.

The lithographic tool arrangement 500 also comprises a shared housing assembly 514 to isolate it from the ambient environment. The transfer assembly 510 is coupled to a defect scan tool 516 located between the first and second cluster tools 504 and 506. The defect scan tool 516 analyzes a semiconductor workpiece to identify defects generated upstream from the second cluster tool 506. The lithographic tool arrangement 500 also comprises a common delivery apparatus 518 for delivery of chemical materials to the lithographic tools 504a-504d and 508a-508d. The chemical materials from the common delivery apparatus 518 can be shared and recycled 520 between the cluster tools 502 and 506. The chemical materials from the common delivery apparatus 518 can also be shared and recycled 522 between the lithographic tools 504a-504d and 508a-508d. The lithographic tools 504a-504d and 508a-508d, transfer assembly 510, defect scan tool 516, and common delivery apparatus 518 are independently controlled by a centralized controller 524.

Note that while the lithographic tool arrangement 500 comprises two cluster tools, 502 and 506, that share a single transfer assembly it will be appreciated to one of ordinary skill in the art that other embodiments may comprise three or more cluster tools with multiple transfer assemblies between each pair of cluster tools, or a single transfer assembly that operates between any combination of cluster tools.

Figure 6:
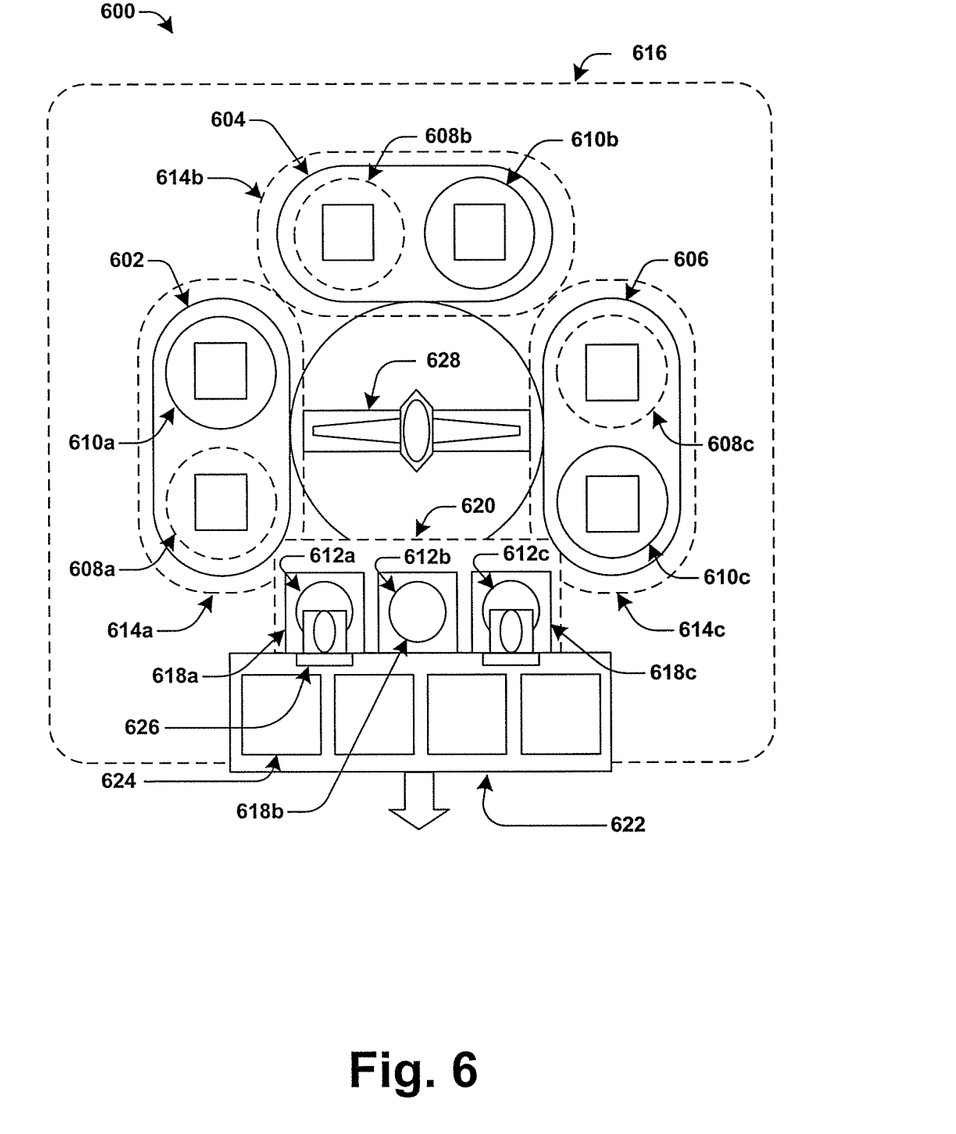
FIG. 6 illustrates some detailed embodiments of a lithographic tool arrangement for semiconductor workpiece processing comprising three exposure tools housed in a vacuum chamber.

FIG. 6 illustrates some embodiments of a lithographic tool arrangement 600 for semiconductor workpiece processing comprising of three exposure tools 602, 604, and 606, each comprising an alignment stage 608a-608c and an exposure stage 610a-610c, respectively. Each exposure tool 602, 604, and 606 is housed in a vacuum chamber, 614a-614c respectively, that achieve an ultra-high vacuum, or UHV (e.g., $1 \times 10^{-12}$ to $1 \times 10^{-9}$ Torr). The lithographic tool arrangement 600 further comprises a shared housing assembly comprising a vacuum chamber 616, which in this embodiment comprises of a medium vacuum chamber (e.g., $1 \times 10^{-3}$ to 25 Torr). The three exposure tools 602, 604, and 606 of the lithographic tool arrangement 600 can accommodate three separate semiconductor workpieces 612a-612c, which can be loaded into the medium vacuum chamber 616 through three load locks 618a-618c, respectively. Loadlocks 618a-618c are each kept at a low vacuum (e.g., 25 to 760 Torr) in a vacuum chamber 620. In this embodiment the exposure tools 602, 604, and 606 as well as the loadlocks 618a-618c, are positioned radially about a central transfer arm 628. When not in use, the semiconductor workpieces 612a-612c can be moved out of loadlocks 618a-618c and housed in a Standard Mechanical InterFace, or SMIF pod 622 that keeps the semiconductor workpieces 612a-612c isolated from contamination. The SMIF pod 622 contains a wafer cassette 624 in which the wafers can be stored horizontally. Therefore, SMIF pod 622 can house many more wafers than the three that can be used by the lithographic tool arrangement 600 at any given time.

To expose a semiconductor workpiece, 612a for instance, the workpiece is moved from the wafer cassette 624 in the SMIF pod 622 via a transfer arm 626 into a given loadlock, 618a. The semiconductor workpiece 612a is then moved out of the loadlock 618a, through the medium vacuum chamber 616 via the central transfer arm 628, and into a selected exposure tool 602, 604, or 606. For this embodiment each exposure tool may be unique. For instance, exposure tool 602 may comprise an extreme ultraviolet (EUV) tool, whereas exposure tool 604 may comprise an electron beam direct write (EBDW) tool. The central transfer arm 628 places the semiconductor workpiece 612a onto the alignment stage 608a-608c of a given exposure tool, 602, 604, and 606 respectively. For this embodiment consider exposure tool 602 comprising of an extreme ultraviolet (EUV) illumination tool. The semiconductor workpiece 612a is thus placed on the alignment stage 608a of exposure tool 602, and aligned with a photomask (not shown). The photomask contains a pattern that will be transferred to the semiconductor workpiece 612a in a manner that will be described below. After alignment the semiconductor workpiece 612a is transferred within exposure tool 602 to the exposure stage 610a. The semiconductor workpiece 612a is then subjected to extreme ultraviolet electromagnetic radiation. The photomask pattern will shield some portions of the semiconductor workpiece 612a from the electromagnetic radiation, while leaving other portions of the semiconductor workpiece 612a covered, thus transferring the photomask pattern onto the semiconductor workpiece 612a.

Figure 7:
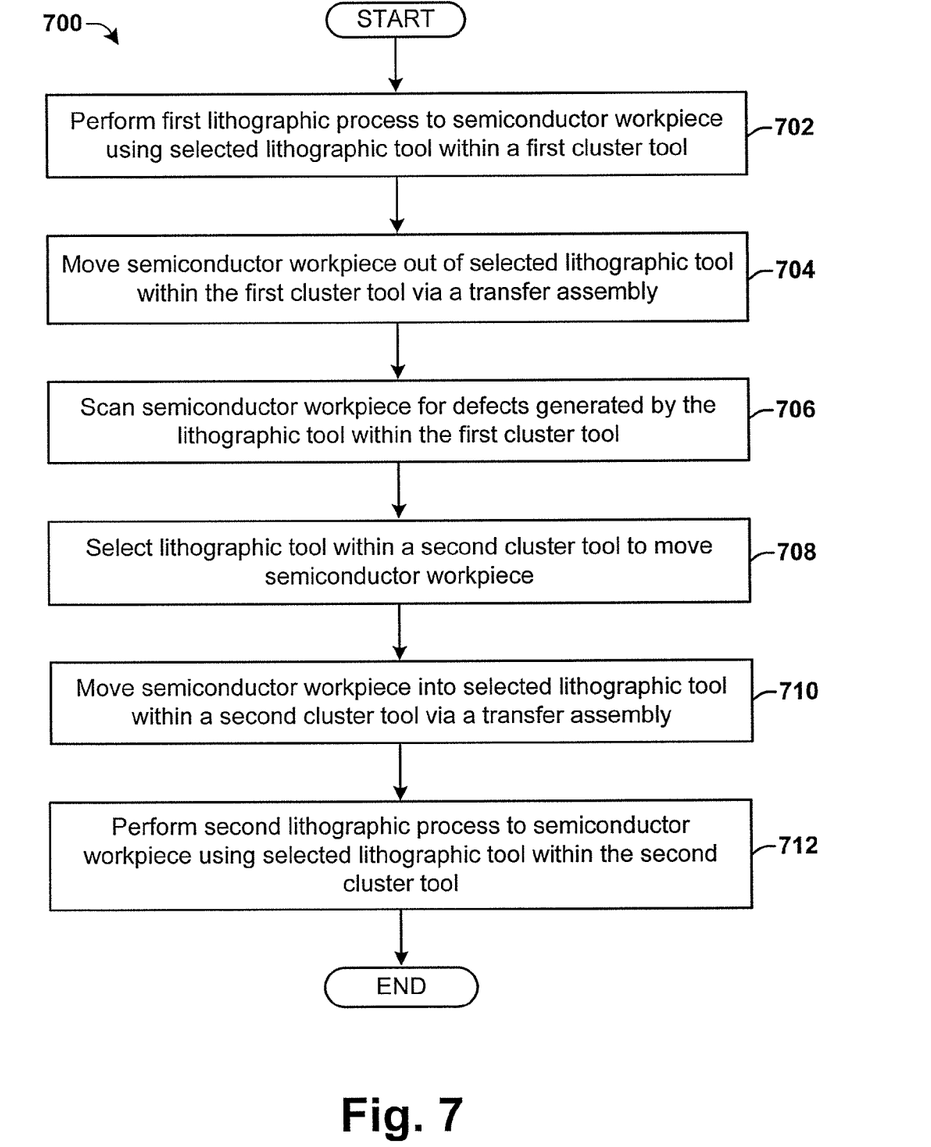
FIG. 7 illustrates a flow diagram of some embodiments of a method for operating a lithographic tool arrangement for semiconductor workpiece processing.

FIG. 7 illustrates a flow diagram of some embodiments of a method 700 for operating a lithographic tool arrangement for semiconductor workpiece processing configured to group a plurality of lithographic tools of a given type into clusters. The method 700 allows for selective transfer of a semiconductor workpiece between any one of a plurality of lithographic tools in a first cluster to any one of a plurality of lithographic tools in a second cluster. While method 700 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At step 702 a first lithographic process is performed to a semiconductor workpiece using a selected lithographic tool within a first cluster tool. In some embodiments, the first lithographic process may comprise baking, coating, exposing and developing of a semiconductor workpiece.

At step 704 a transfer assembly moves the semiconductor workpiece out of the lithographic tool within the first cluster tool.

At step 706 the semiconductor workpiece is scanned with a defect monitoring tool to identify defects generated within the first lithographic tool.

At step 708 the transfer assembly selects a lithographic tool from plurality of lithographic tools contained within a second cluster tool.

At step 710 the transfer assembly moves the semiconductor workpiece into the selected lithographic tool within the second cluster tool.

At step 712 a second lithographic process is performed to the semiconductor workpiece using the selected lithographic tool within the second cluster tool. In some embodiments, the second lithographic process may comprise baking, coating, exposing and developing of a semiconductor workpiece.

It will also be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein; such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein Therefore, the present disclosure relates to a lithographic tool arrangement for semiconductor workpiece processing configured to group lithographic tools into clusters, and to selectively transfer a semiconductor workpiece between any one of a plurality of lithographic tools of a first type in a first cluster to any one of a plurality of lithographic tools of a second type in a second cluster. In various embodiments the lithographic tools comprise baking, coating, exposure, and development units configured to provide a modularization of these various components to optimize throughput and efficiency for a given lithographic process.

In some embodiments, the lithographic tool arrangement for semiconductor workpiece processing comprises a first cluster tool comprising a plurality of lithographic tools of a first type, a second cluster tool comprising a plurality of lithographic tools of a second type, and a transfer assembly. The transfer assembly moves a semiconductor workpiece from any one of a plurality of lithographic tools in a first cluster to any one of a plurality of lithographic tools in a second cluster. The lithographic tool arrangement further comprises a shared housing assembly for each cluster tool which serves to isolate their respective lithographic tools from the ambient environment. Each cluster tool also comprises a controller which allows for independent control of their respective lithographic tools. The lithographic tool arrangement of this embodiment also contains a common delivery apparatus for each cluster tool which allows for delivery chemical materials within each tool, and sharing and recycling of chemical materials between a plurality of lithographic tools within each cluster tool. The transfer assembly is coupled to a defect scan tool to analyze a semiconductor workpiece and identify defects generated upstream of the second cluster tool.

In some embodiments, the lithographic tool arrangement for semiconductor workpiece processing comprises a first cluster tool comprising a plurality of lithographic tools of a first type, a second cluster tool comprising a plurality of lithographic tools of a second type, and a transfer assembly. The transfer assembly moves a semiconductor workpiece from any one of a plurality of lithographic tools in a first cluster to any one of a plurality of lithographic tools in a second cluster. The lithographic tool arrangement of this embodiment further comprises a shared housing assembly to isolate it from the ambient environment. A transfer assembly is coupled to a defect scan tool to analyze a semiconductor workpiece and identify defects generated upstream of the second cluster tool. The lithographic tool arrangement of this embodiment also contains a common delivery apparatus for delivery of chemicals to the lithographic tools within the first and second cluster tools. The chemical materials from the common delivery apparatus can be shared and recycled between cluster tools and between the lithographic tools within each cluster tools. The lithographic tools, transfer assembly, defect scan tool, and common delivery apparatus of this embodiment are all controlled independently by one centralized controller.

In some embodiments the present disclosure relates to a method for operating a lithographic tool arrangement for semiconductor workpiece processing configured to group lithographic tools into clusters, and to selectively transfer a semiconductor workpiece between any one of a plurality of lithographic tools of a first type within a first cluster to any one of a plurality of lithographic tools of a second type within a second cluster. The method comprises performing a first lithographic process to a semiconductor workpiece using a selected lithographic tool within a first cluster. After the first process, a transfer assembly moves the semiconductor workpiece out of the lithographic tool within the first cluster. A defect monitoring tool the scans the semiconductor workpiece to identify defects generated upstream from the second lithographic tool. The method further comprises selecting a lithographic tool from plurality of lithographic tools contained within a second cluster, and moving the semiconductor workpiece into selected lithographic tool within the second cluster tool via a transfer assembly. A second lithographic process is performed to the semiconductor workpiece using the selected lithographic tool within a second cluster tool.

What is claimed is:

1. A lithographic tool arrangement for semiconductor workpiece processing, comprising:
    a first cluster tool comprising a plurality of lithographic tools of a first type;
    a second cluster tool comprising a plurality of lithographic tools of a second type, wherein the second type is different from the first type;
    a first common delivery apparatus for the first cluster tool configured to deliver chemical materials to the lithographic tools within the first cluster tool;
    a second common delivery apparatus for the second cluster tool configured to deliver chemical materials to the lithographic tools within the second cluster tool; and a first transfer assembly configured to move a semiconductor workpiece from any one of the plurality of lithographic tools of the first type to any one of the plurality of lithographic tools of the second type.

2. The lithographic tool arrangement of claim 1, further comprising:
a first shared housing assembly for the first cluster tool configured to isolate the first cluster tool from an ambient environment surrounding the first cluster tool; and
a second shared housing assembly for the second cluster tool configured to isolate the second cluster tool from an ambient environment surrounding the second cluster tool.

3. The lithographic tool arrangement of claim 2, wherein the first and second shared housing assemblies comprise vacuum chambers.

4. The lithographic tool arrangement of claim 1, further comprising:
a first controller for the first cluster tool configured to independently control the lithographic tools within the first cluster tool; and
a second controller for second cluster tool configured to independently control the lithographic tools within the second cluster tool.

5. The lithographic tool arrangement of claim 1, wherein the first and second common delivery apparatuses are configured to:
share and recycle chemical materials between lithographic tools within the first and second cluster tools, respectively.

6. The lithographic tool arrangement of claim 1, wherein the first or second cluster tool comprises:
a baking unit comprising a plurality of baking chambers configured to subject a semiconductor workpiece to an elevated temperature for lithographic processing.

7. The lithographic tool arrangement of claim 1, wherein the first or second cluster tool comprises:
a coating unit comprising a plurality of spin coaters configured to coat a semiconductor workpiece with chemicals for lithographic processing.

8. The lithographic tool arrangement of claim 1, further comprising:
a third cluster tool comprising a plurality of lithographic tools of a third type; and
a second transfer assembly configured to move a semiconductor workpiece from any one of the plurality of lithographic tools of the second type to any one of the plurality of lithographic tools of a third type.

9. The lithographic tool arrangement of claim 1, wherein:
the first and second cluster tools are positioned radially about the first transfer assembly.

10. A lithographic tool arrangement comprising:
a plurality of cluster tools each comprising a plurality of lithographic tools of a same type;
a transfer assembly configured to move a semiconductor workpiece between the respective cluster tools;
a controller configured to independently control the respective lithographic tools within the cluster tools;
a common delivery apparatus configured to
deliver chemical materials to the respective lithographic tools within the cluster tools;
share and recycle chemical materials between the lithographic tools within the cluster tools;
share and recycle chemical materials between the cluster tools; and
a shared housing assembly configured to house the plurality of cluster tools, transfer assembly, controller, and common delivery apparatus to isolate them from an ambient environment surrounding them.

11. The lithographic tool arrangement of claim 10, wherein each lithographic tool further comprises:
an illumination tool comprising an alignment stage and an exposure stage.

12. The lithographic tool arrangement of claim 11, wherein the illumination tools further comprises:
an extreme ultraviolet (EUV) or electron beam direct write (EBDW) illuminator tool.

13. The lithographic tool arrangement of claim 10, wherein the plurality of cluster tools are positioned radially about the transfer assembly.

14. The lithographic tool arrangement of claim 10, wherein the shared housing assembly comprises:
a first vacuum chamber; and
a loadlock positioned radially about the transfer assembly and configured to move the semiconductor workpiece in and out of the shared housing assembly.

15. The lithographic tool arrangement of claim 14, further comprising:
a plurality of vacuum chambers, wherein:
a second vacuum chamber surrounds the loadlock;
a third vacuum chamber surrounds each lithographic tool of a certain type; and
the transfer assembly moves the semiconductor workpiece between the second vacuum chamber surrounding the loadlock, though the first vacuum chamber of the shared housing assembly, and into the third vacuum chamber surrounding the respective lithographic tools.

16. The lithographic tool arrangement of claim 10, wherein each cluster tool comprises a baking unit comprising a plurality of baking chambers configured to subject a semiconductor workpiece to an elevated temperature for lithographic processing.

17. The lithographic tool arrangement of claim 10, wherein each cluster tool comprises a coating unit comprising a plurality of spin coaters configured to coat a semiconductor workpiece with chemicals for lithographic processing.

18. The lithographic tool arrangement of claim 10, wherein each cluster tool comprises a developing unit comprising a plurality of developing chambers configured to treat a semiconductor workpiece with chemical materials for lithographic processing.

19. A lithographic tool arrangement for semiconductor workpiece processing, comprising:
a first cluster tool comprising a plurality of lithographic tools;
a second cluster tool comprising a developing unit including a plurality of developing apparatuses configured to treat a plurality semiconductor workpieces with chemical materials for lithographic processing, wherein the plurality of lithographic tools are different from the plurality of developing chambers; and
a transfer assembly configured to move a plurality of semiconductor workpieces from any one of the plurality of lithographic tools to any one of the plurality of developing apparatuses.

20. A lithographic tool arrangement for semiconductor workpiece processing, comprising:
a first cluster tool comprising a plurality of lithographic tools of a first type;
a second cluster tool comprising a plurality of lithographic tools of a second type, wherein the second type is different from the first type;

a first transfer assembly configured to move a semiconductor workpiece from any one of the plurality of lithographic tools of the first type to any one of the plurality of lithographic tools of the second type; and
a defect scan tool located between the first and second cluster tools configured to analyze a semiconductor workpiece and identify defects generated upstream of the second cluster tool.

\* \* \* \* \*